United States Patent
Nanba et al.

(10) Patent No.: US 8,152,933 B2
(45) Date of Patent: Apr. 10, 2012

(54) SUBSTRATE PROCESSING APPARATUS, SUBSTRATE PROCESSING METHOD, AND DRAIN CUP CLEANING METHOD

(75) Inventors: Hiromitsu Nanba, Koshi (JP); Norihiro Ito, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 561 days.

(21) Appl. No.: 12/308,395

(22) PCT Filed: Oct. 4, 2007

(86) PCT No.: PCT/JP2007/069455
§ 371 (c)(1),
(2), (4) Date: Dec. 15, 2008

(87) PCT Pub. No.: WO2008/041741
PCT Pub. Date: Apr. 10, 2007

(65) Prior Publication Data
US 2010/0212701 A1    Aug. 26, 2010

(30) Foreign Application Priority Data

Oct. 5, 2006  (JP) ................................ 2006-274303
Oct. 5, 2006  (JP) ................................ 2006-274304

(51) Int. Cl.
*B08B 7/00*  (2006.01)
*B08B 3/04*  (2006.01)
(52) U.S. Cl. .......................... 134/33; 134/26; 134/104.1
(58) Field of Classification Search ..................... 134/33, 134/104.1
See application file for complete search history.

(56) References Cited

U.S. PATENT DOCUMENTS

| 5,001,084 A | * | 3/1991 | Kawai et al. | 438/782 |
| 6,207,231 B1 | * | 3/2001 | Tateyama | 427/240 |
| 6,432,199 B1 | * | 8/2002 | Takekuma | 118/52 |
| 2002/0162574 A1 | * | 11/2002 | Satou et al. | 134/10 |

FOREIGN PATENT DOCUMENTS

| JP | 2000-315671 | 11/2000 |
| JP | 2002-368066 | 12/2002 |

\* cited by examiner

*Primary Examiner* — Michael Barr
*Assistant Examiner* — Caitlin N Dennis
(74) *Attorney, Agent, or Firm* — Smith, Gambrell & Russell, LLP

(57) ABSTRACT

A substrate processing apparatus includes a substrate holding member configured to rotate along with a wafer (W) held thereon and a drain cup (51) configured to surround the wafer (W). A cleaning process is performed by rotating the wafer (W) while supplying a process liquid onto the wafer (W), and then a rinsing process is performed by rotating the wafer (W) in a similar way while supplying a rinsing liquid onto the wafer (W). The rinsing process is performed by first adjusting a rotational speed of the wafer (W) to be the same as the rotational speed used in the cleaning process while supplying the rinsing liquid, and then raising a liquid level of the rinsing liquid inside the drain cup (51) by decreasing the rotational speed of the wafer (W) or increasing a flow rate of the rinsing liquid, and raising a reach position of the rinsing liquid on the outer sidewall of the drain cup (51) by increasing the rotational speed of the wafer (W).

6 Claims, 7 Drawing Sheets

SUBSTRATE PROCESSING APPARATUS, SUBSTRATE PROCESSING METHOD, AND DRAIN CUP CLEANING METHOD

TECHNICAL FIELD

The present invention relates to a substrate processing apparatus and substrate processing method for performing a predetermined liquid process, such as a cleaning process, on a substrate, such as a semiconductor wafer. The present invention further relates to a drain cup cleaning method for cleaning a drain cup configured to receive drainage in the substrate processing apparatus.

BACKGROUND ART

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate.

As a substrate processing apparatus used for this purpose, there is known an apparatus in which a substrate, such as a semiconductor wafer, is held on a spin chuck, and a process liquid, such as a chemical liquid, is supplied onto the wafer, while the wafer is rotated, so that a cleaning process is performed. In general, an apparatus of this kind is operated such that a process liquid is supplied onto the center of a wafer or substrate, and the substrate is rotated to spread the process liquid outward, so as to form a liquid film and throw off the process liquid outward from the substrate. Then, after the cleaning process, a rinsing liquid, such as purified water, is supplied onto the substrate while the substrate is rotated in the same way, thereby performing a rinsing process to form a liquid film of the rinsing liquid and throw off the rinsing liquid outward from the substrate. In light of the processes described above, a drain cup is disposed to surround the substrate to receive and discharge the process liquid or rinsing liquid thrown off outward from substrate (for example, Jpn. Pat. Appln. KOKAI Publication No. 2002-368066).

In substrate processing apparatuses of this kind, when a rinsing process is performed on a substrate after a cleaning process is performed by use of a process liquid, such as an alkaline chemical liquid or acidic chemical liquid, it is necessary to remove not only the process liquid on the substrate but also the process liquid left on the drain cup. Specifically, if the alkaline chemical liquid or acidic chemical liquid are left on the drain cup after the rinsing process, the substrate drying performance is adversely affected by formation of salts due to evaporation of the chemical liquid or reaction between alkaline and acidic chemical liquids continuously used for the cleaning process. Where a plurality of chemical liquids, such as an alkaline chemical liquid and an acidic chemical liquid, are collected and reused, the chemical liquids are mixed with each other and thereby degraded at higher rate. Accordingly, the process liquid left on the drain cup should be sufficiently removed by a process performed along with or separately from the rinsing process periodically or as needed.

However, in conventional rinsing processes, the rinsing liquid cannot be sufficiently supplied overall inside the drain cup, and so the process liquid is left inside the drain cup, and makes it difficult to solve the problem described above. There is a case where the drain cup is provided with a cleaning mechanism for performing a cup cleaning process, but this brings about problems such that the apparatus becomes complex and bulky.

DISCLOSURE OF INVENTION

An object of the present invention is to provide a substrate processing apparatus and substrate processing method that can sufficiently remove a process liquid from inside a drain cup when a rinsing process is performed after a substrate process is performed by use of the process liquid.

An alternative object of the present invention is to provide a drain cup cleaning method that can reliably perform cleaning of a drain cup without using a special cleaning mechanism, wherein the drain cup is configured to receive a process liquid in a substrate processing apparatus for processing a substrate by use of the process liquid.

Another alternative object of the present invention is to provide a storage medium that stores a control program for executing the substrate processing method or drain cup cleaning method described above.

According to a first aspect of the present invention, there is provided a substrate processing apparatus comprising: a substrate holding member configured to rotate along with a substrate held thereon in a horizontal state; a rotation mechanism configured to rotate the substrate holding member; a process liquid supply mechanism configured to supply a process liquid onto the substrate; a rinsing liquid supply mechanism configured to supply a rinsing liquid onto the substrate; an annular drain cup configured to surround the substrate held on the substrate holding member and to receive and discharge the process liquid or rinsing liquid scattered from the substrate being rotated, the drain cup including an outer sidewall that surrounds a lateral side of an edge of the substrate and an internal wall that surrounds a lower side of the edge of the substrate; and a control section configured to control supply of the process liquid, supply of the rinsing liquid, and a rotational speed of the substrate, so as to perform a substrate process on the substrate while rotating the substrate held on the substrate holding member by the rotate mechanism and supplying the process liquid onto the substrate from the process liquid supply mechanism, and then to perform a rinsing process while rotating the substrate in a similar way and supplying the rinsing liquid onto the substrate from the rinsing liquid supply mechanism, wherein the control section is preset to control the rinsing process, subsequently to the substrate process, by first adjusting a rotational speed of the substrate to be the same as the rotational speed used in the substrate process while supplying the rinsing liquid, and then raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate.

In the first aspect, the control section may be preset to perform the rinsing process by first using the rotational speed of the substrate process, then raising the liquid level, and then raising the reach position of the rinsing liquid on the outer sidewall of the drain cup. Alternatively, the control section may be preset to perform the rinsing process by first using the rotational speed of the substrate process, then raising the reach position of the rinsing liquid on the outer sidewall of the drain cup, and then raising the liquid level.

The control section may be preset to set the rotational speed of the substrate to be 200 to 700 rpm in the substrate process, to set the rotational speed of the substrate to be 50 to 200 rpm in said raising the liquid level, and to set the rotational speed of the substrate to be 500 to 1,500 rpm in said raising the reach position of the rinsing liquid on the outer sidewall of the drain cup.

The apparatus may further comprise a rotary cup configured to surround the substrate held on the substrate holding member, to rotate along with the substrate holding member and the substrate, and to receive the process liquid or rinsing liquid thrown off from the substrate being rotated and guide the process liquid or rinsing liquid to the drain cup.

The substrate processing apparatus may be arranged such that the process liquid supply mechanism is configured to supply a first process liquid and a second process liquid, the control section is configured to control supply of the first and second process liquids, supply of the rinsing liquid, and a rotational speed of the substrate, so as to perform a first process on the substrate while rotating the substrate held on the substrate holding member by the rotate mechanism and supplying the first process liquid onto the substrate from the process liquid supply mechanism, then to perform a first rinsing process while rotating the substrate in a similar way and supplying the rinsing liquid onto the substrate from the rinsing liquid supply mechanism, then to perform a second process on the substrate while rotating the substrate in a similar way and supplying the second process liquid onto the substrate from the process liquid supply mechanism, and then to perform a second rinsing process while rotating the substrate in a similar way and supplying the rinsing liquid onto the substrate from the rinsing liquid supply mechanism, and the control section is preset to control at least the first rinsing process by first adjusting a rotational speed of the substrate to be the same as the rotational speed used in the substrate process while supplying the rinsing liquid, and then raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate.

According to a first aspect of the present invention, there is provided a substrate processing method performed in a substrate processing apparatus that comprises a substrate holding member configured to rotate along with a substrate held thereon in a horizontal state, a rotation mechanism configured to rotate the substrate holding member, a process liquid supply mechanism configured to supply a process liquid onto the substrate, a rinsing liquid supply mechanism configured to supply a rinsing liquid onto the substrate, and an annular drain cup configured to surround the substrate held on the substrate holding member and to receive and discharge the process liquid or rinsing liquid scattered from the substrate being rotated, the drain cup including an outer sidewall that surrounds a lateral side of an edge of the substrate and an internal wall that surrounds a lower side of the edge of the substrate, the method comprising: performing a substrate process on the substrate while rotating the substrate held on the substrate holding member by the rotate mechanism and supplying the process liquid onto the substrate from the process liquid supply mechanism; and then performing a rinsing process while rotating the substrate in a similar way and supplying the rinsing liquid onto the substrate from the rinsing liquid supply mechanism, wherein the rinsing process comprising adjusting a rotational speed of the substrate to be the same as the rotational speed used in the substrate process while supplying the rinsing liquid, raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate.

In the second aspect, the substrate processing method may be arranged such that the process liquid supply mechanism is configured to supply a first process liquid and a second process liquid, said performing a substrate process on the substrate while supplying the process liquid comprises performing a first process on the substrate while supplying the first process liquid onto the substrate and performing a second process on the substrate while supplying the second process liquid onto the substrate, said performing a rinsing process comprises performing a first rinsing process subsequently to the first process and performing a second rinsing process subsequently to the second process, and at least the first rinsing process comprises first adjusting a rotational speed of the substrate to be the same as the rotational speed used in the substrate process while supplying the rinsing liquid, raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate. In this case, the substrate processing method may be arranged such that the second rinsing process comprises adjusting a rotational speed of the substrate to be the same as the rotational speed used in the substrate process while supplying the rinsing liquid, raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate.

In the second aspect, the method may be preset to perform the rinsing process by first using the rotational speed of the substrate process, then raising the liquid level, and then raising the reach position of the rinsing liquid on the outer sidewall of the drain cup. Alternatively, the method may be preset to perform the rinsing process by first using the rotational speed of the substrate process, then raising the reach position of the rinsing liquid on the outer sidewall of the drain cup, and then raising the liquid level.

The method may be preset to set the rotational speed of the substrate to be 200 to 700 rpm in the substrate process, to set the rotational speed of the substrate to be 50 to 200 rpm in said raising the liquid level, and to set the rotational speed of the substrate to be 500 to 1,500 rpm in said raising the reach position of the rinsing liquid on the outer sidewall of the drain cup.

According to a third aspect of the present invention, there is provided a drain cup cleaning method for cleaning a drain cup of a substrate processing apparatus that comprises a substrate holding member configured to rotate along with a substrate held thereon in a horizontal state, a rotation mechanism configured to rotate the substrate holding member, a process liquid supply mechanism configured to supply a process liquid onto the substrate, a rinsing liquid supply mechanism configured to supply a rinsing liquid onto the substrate, and an annular drain cup configured to surround the substrate held on the substrate holding member and to receive and discharge the process liquid or rinsing liquid scattered from the substrate being rotated, the drain cup including an outer sidewall that surrounds a lateral side of an edge of the substrate and an internal wall that surrounds a lower side of the edge of the substrate, wherein a substrate process is performed on the substrate while rotating the substrate held on the substrate holding member by the rotate mechanism and supplying the process liquid onto the substrate from the process liquid supply mechanism, the method comprising: holding the substrate or a dummy substrate on the substrate holding member; rotating the substrate or dummy substrate while supplying the rinsing liquid onto the substrate or dummy substrate, thereby rinsing a process liquid flow passage of the drain cup by the rinsing liquid thrown off from the substrate or dummy substrate; raising a liquid level of the rinsing liquid inside the drain cup by decreasing the rotational speed of the substrate or dummy substrate or increasing a flow rate of the rinsing liquid, as compared to that used in said rinsing a process liquid flow passage, and raising a reach position of the rinsing liquid on the outer sidewall of the drain cup by increasing the rotational speed of the substrate or dummy substrate, as compared to that used in said rinsing a process liquid flow passage.

In the third aspect, the method may be preset to perform said rinsing a process liquid flow passage, then raising the liquid level, and then raising the reach position of the rinsing liquid on the outer sidewall of the drain cup. Alternatively, the method may be preset to perform said rinsing a process liquid flow passage, then raising the reach position of the rinsing liquid on the outer sidewall of the drain cup, and then raising the liquid level.

The method may be preset to set the rotational speed of the substrate to be 200 to 700 rpm in said rinsing a process liquid flow passage, to set the rotational speed of the substrate to be 50 to 200 rpm in said raising the liquid level, and to set the rotational speed of the substrate to be 500 to 1,500 rpm in said raising the reach position of the rinsing liquid on the outer sidewall of the drain cup.

According to a fourth aspect of the present invention, there is provided a computer readable storage medium that stores a control program for execution on a computer, which is used for controlling a substrate processing apparatus that comprises a substrate holding member configured to rotate along with a substrate held thereon in a horizontal state, a rotation mechanism configured to rotate the substrate holding member, a process liquid supply mechanism configured to supply a process liquid onto the substrate, a rinsing liquid supply mechanism configured to supply a rinsing liquid onto the substrate, and an annular drain cup disposed around the rotary cup and configured to receive and discharge the process liquid or rinsing liquid scattered from the substrate being rotated, the drain cup including an outer sidewall that surrounds a lateral side of an edge of the substrate and an internal wall that surrounds a lower side of the edge of the substrate, wherein the control program, when executed, causes the computer to control the substrate processing apparatus to conduct a substrate processing method comprising: performing a substrate process on the substrate while rotating the substrate held on the substrate holding member by the rotation mechanism and supplying the process liquid onto the substrate from the process liquid supply mechanism; and then performing a rinsing process while rotating the substrate in a similar way and supplying the rinsing liquid onto the substrate from the rinsing liquid supply mechanism, wherein the rinsing process comprising adjusting a rotational speed of the substrate to be the same as the rotational speed used in the substrate process while supplying the rinsing liquid, raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate.

According to a fifth aspect of the present invention, there is provided a computer readable storage medium that stores a control program for execution on a computer, which is used for controlling a substrate processing apparatus that comprises a substrate holding member configured to rotate along with a substrate held thereon in a horizontal state, a rotation mechanism configured to rotate the substrate holding member, a process liquid supply mechanism configured to supply a process liquid onto the substrate, a rinsing liquid supply mechanism configured to supply a rinsing liquid onto the substrate, and an annular drain cup disposed around the rotary cup and configured to receive and discharge the process liquid or rinsing liquid scattered from the substrate being rotated, the drain cup including an outer sidewall that surrounds a lateral side of an edge of the substrate and an internal wall that surrounds a lower side of the edge of the substrate, wherein the control program, when executed, causes the computer to control the substrate processing apparatus to conduct a drain cup cleaning method for cleaning the drain cup, the method comprising: holding the substrate or a dummy substrate on the substrate holding member; rotating the substrate or dummy substrate while supplying the rinsing liquid onto the substrate or dummy substrate, thereby rinsing a process liquid flow passage of the drain cup by the rinsing liquid thrown off from the substrate or dummy substrate; raising a liquid level of the rinsing liquid inside the drain cup by decreasing the rotational speed of the substrate or dummy substrate or increasing a flow rate of the rinsing liquid, as compared to that used in said rinsing a process liquid flow passage, and raising a reach position of the rinsing liquid on the outer sidewall of the drain cup by increasing the rotational speed of the substrate or dummy substrate, as compared to that used in said rinsing a process liquid flow passage.

According to the present invention, while a substrate is held on the substrate holding member, a rinsing process or cup cleaning is preformed by first adjusting a rotational speed of the substrate to be the same as the rotational speed used in the substrate process while supplying the rinsing liquid, and then raising a liquid level of the rinsing liquid inside the drain cup by decreasing the rotational speed of the substrate or increasing a flow rate of the rinsing liquid, and raising a reach position of the rinsing liquid on the outer sidewall of the drain cup by increasing the rotational speed of the substrate. Consequently, the rinsing liquid can be sufficiently supplied overall inside the drain cup, so that the process liquid is almost entirely removed from inside the drain cup.

BEST MODE FOR CARRYING OUT THE INVENTION

An embodiment of the present invention will now be described with reference to the accompanying drawings. Hereinafter, an explanation will be given of a case where the present invention is applied to a liquid processing apparatus that can perform a cleaning process on the front and back surfaces of a semiconductor wafer (which will be simply referred to as "wafer", hereinafter).

Figure 1:
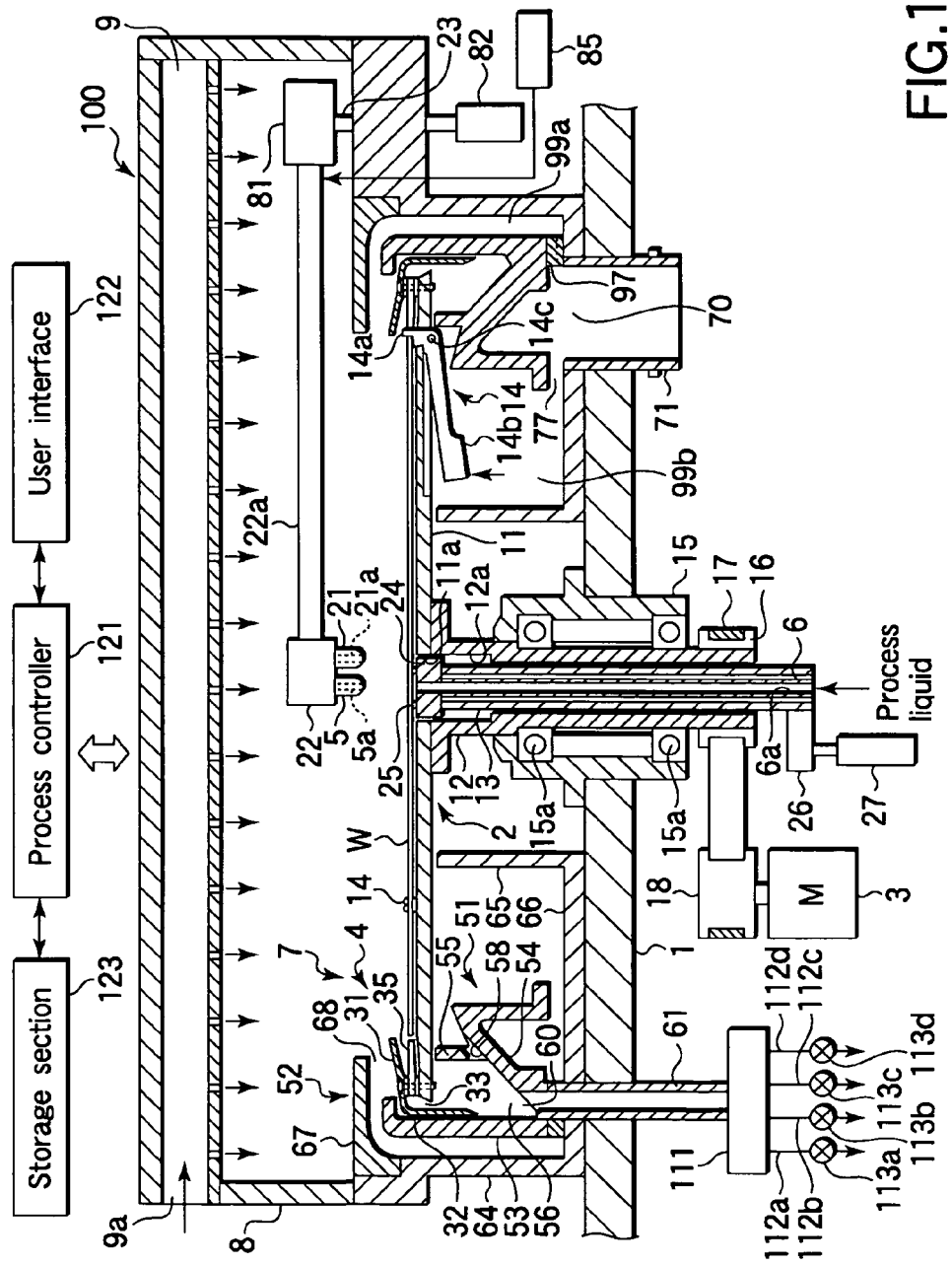
[FIG. 1] This is a sectional view schematically showing the structure of a substrate processing apparatus according to an embodiment of the present invention.
Figure 2:
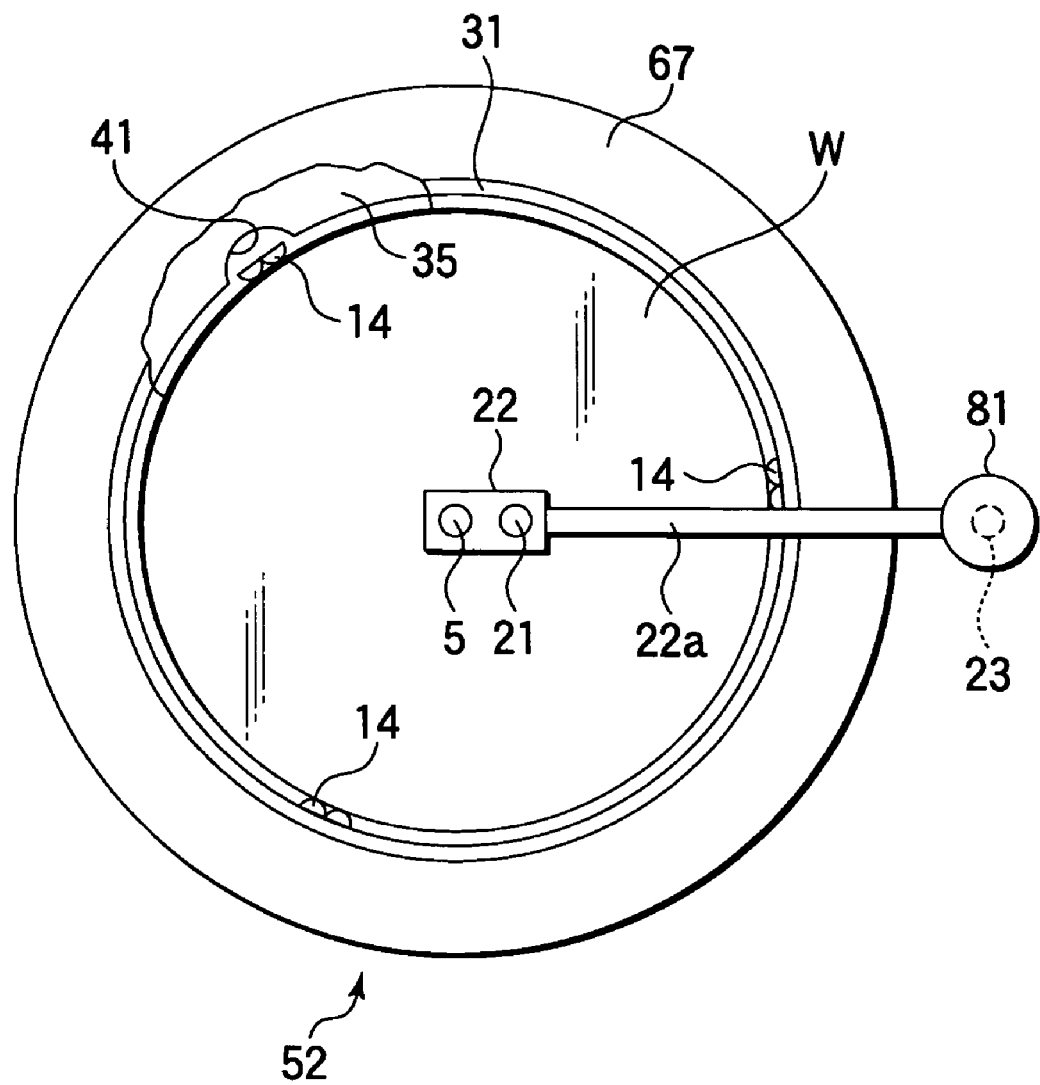
[FIG. 2] This is a partially sectional plan view schematically showing the substrate processing apparatus according to the embodiment of the present invention.
Figure 3:
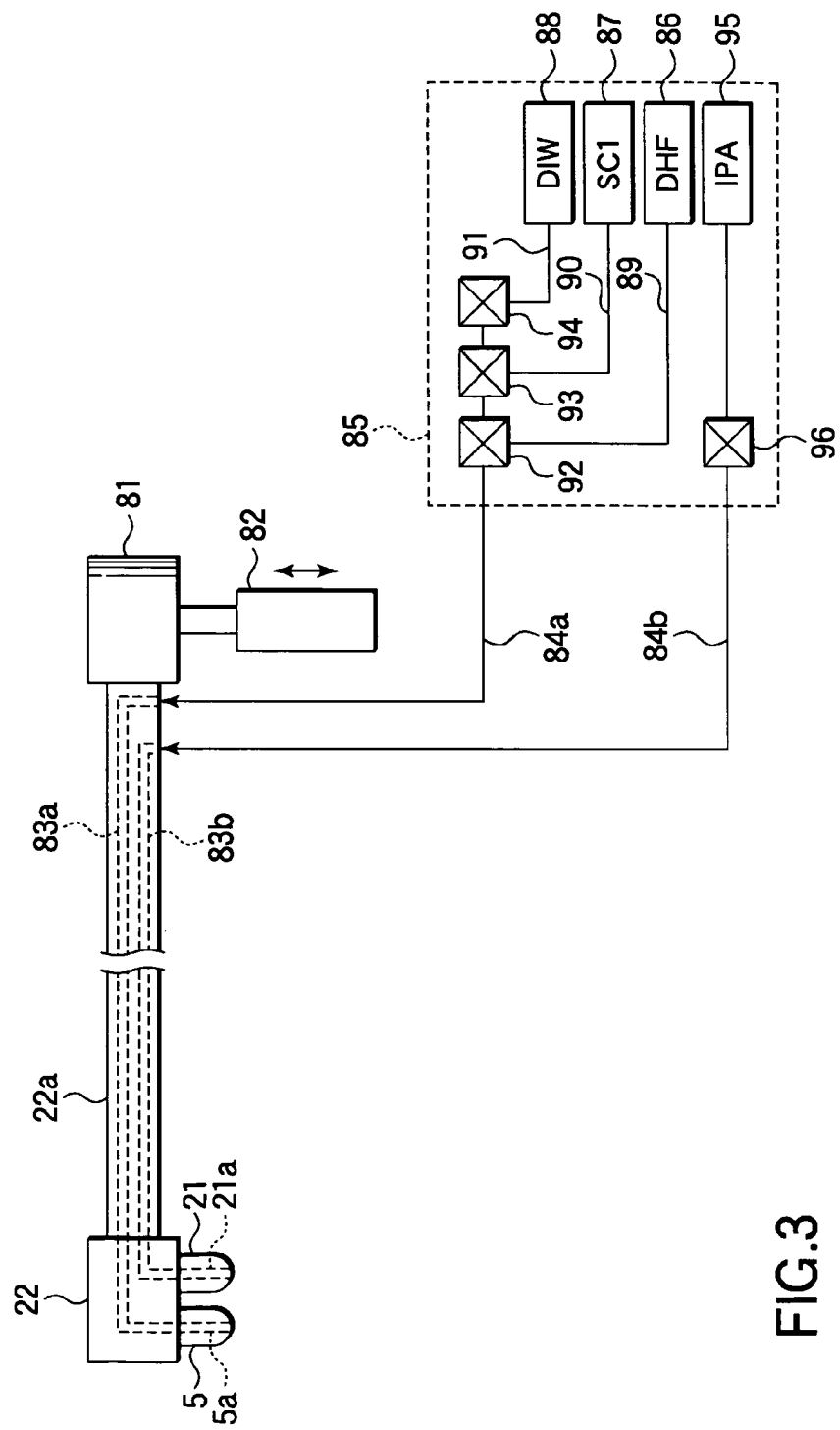
[FIG. 3] This is a view schematically showing a liquid supply mechanism used in the substrate processing apparatus shown in FIG. 1.
Figure 4:
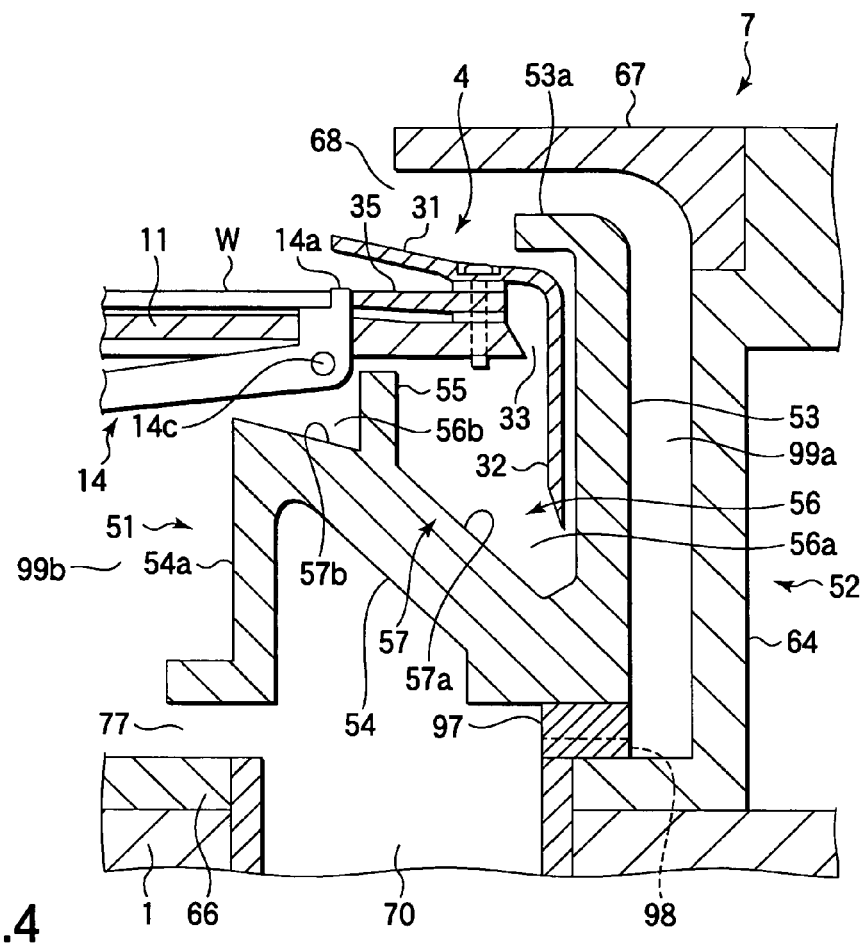
[FIG. 4] This is an enlarged sectional view showing an exhaust/drain section used in the substrate processing apparatus shown in FIG. 1.

FIG. 1 is a sectional view schematically showing the structure of a substrate processing apparatus according to an embodiment of the present invention. FIG. 2 is a plan view of the substrate processing apparatus shown in FIG. 1. FIG. 3 is a view schematically showing a process liquid supply mechanism and a rinsing liquid supply mechanism used in the substrate processing apparatus shown in FIG. 1. FIG. 4 is an enlarged sectional view showing an exhaust/drain section used in the substrate processing apparatus shown in FIG. 1.

A plurality of substrate processing apparatuses 100 are disposed in a liquid processing system (not shown). Each substrate processing apparatus 100 includes a base plate 1 and a wafer holding member 2 for rotatably holding a target substrate or wafer W. The wafer holding member 2 is rotatable by a rotary motor 3. A rotary cup 4 is disposed to surround the wafer W held on the wafer holding member 2 and to rotate along with the wafer holding member 2. The substrate processing apparatus 100 further includes a front side liquid supply nozzle 5 for supplying a process liquid onto the front surface of the wafer W, and a back side liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a gas flow inlet section 9 at the top, which is arranged to receive, through an inlet port 9a formed on a lateral side, a gas flow supplied from a fan/filter unit (FFU) 9 of the liquid processing system, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. An elevating member 13 supporting the back side liquid supply nozzle 6 is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end, and the shaft of the motor 3 is also provided with a pulley 18 fitted thereon, while a belt 17 is wound around between these pulleys 16 and 18. The rotary shaft 12 is rotated through the pulley 18, belt 17, and pulley 16 by rotation of the motor 3.

The front side liquid supply nozzle 5 is attached to a nozzle holding member 22 supported on the distal end of a nozzle arm 22a. A process liquid or the like is supplied from a liquid supply mechanism 85 described later through a flow passage formed in the nozzle arm 22a, and is then delivered from a nozzle hole 5a formed in the nozzle 5. For example, the process liquid to be thus delivered encompasses a chemical liquid for wafer cleaning, a rising liquid such as purified water, and so forth. The nozzle holding member 22 is further provided with a drying solvent nozzle 21 attached thereon for delivering a drying solvent, such as IPA. A drying solvent, such as IPA, is delivered from a nozzle hole 21a formed in the nozzle 21.

As shown in FIG. 2, the nozzle arm 22a is rotatable by a driving mechanism 81 about a shaft 23 used as a central axis to move the front side liquid supply nozzle 5 between a wafer cleaning position above the wafer W between the center and periphery thereof, and a retreat position outside the wafer W. Further, the nozzle arm 22a is movable up and down by an elevating mechanism 82, such as a cylinder mechanism.

As shown in FIG. 3, the nozzle arm 22a has a flow passage 83a formed therein and connected at one end to the nozzle hole 5a of the front side liquid supply nozzle 5. The other end of the flow passage 83a is connected to a tube 84a. The nozzle arm 22a further has a flow passage 83b formed therein and connected at one end to the nozzle hole 21a of the drying solvent nozzle 21. The other end of the flow passage 83b is connected to a tube 84b. Predetermined process liquids are supplied through the tubes 84a and 84b from the liquid supply mechanism 85. The liquid supply mechanism 85 includes cleaning chemical liquid sources, such as a DHF supply source 86 for supplying dilute hydrofluoric acid (DHF) as an acidic chemical liquid and an SC1 supply source 87 for supplying ammonia hydrogen peroxide solution (SC1) as an alkaline chemical liquid. The liquid supply mechanism 85 further includes a rinsing liquid source, such as a DIW supply source 88 for supplying purified water (DIW), and a drying solvent source, such as an IPA supply source 95 for supplying IPA. The DHF supply source 86, SC1 supply source 87, and DIW supply source 88 are connected to tubes 89, 90, and 91 extending therefrom. The tubes 89, 90, and 91 are connected to the tube 84a through switching valves 92, 93, and 94. Accordingly, ammonia hydrogen peroxide solution (SC1), dilute hydrofluoric acid (DHF), and purified water (DIW) are selectively supplied to the front side liquid supply nozzle 5 by operating the switching valves 92, 93, and 94. In this case, the tube 91 extending from the DIW supply source 88 is connected to the most upstream side of the tube 84a. On the other hand, the IPA supply source 95 is directly connected to the tube 84b extending from the flow passage 83b and provided with a switching valve 96 thereon. Accordingly, IPA is supplied to the drying solvent nozzle 21 by opening the switching valve 96.

In other words, the liquid supply mechanism 85 serves as a process liquid supply mechanism for supplying ammonia hydrogen peroxide solution (SC1) and dilute hydrofluoric acid (DHF) used as cleaning process liquids; a rinsing liquid supply mechanism for supplying purified water (DIW) used as a rinsing liquid; and a drying solvent supply mechanism for supplying IPA used as a drying solvent.

The back side liquid supply nozzle 6 has a nozzle hole 6a formed through the center of the elevating member 13 and extending in the longitudinal direction. A predetermined process liquid is supplied from a process liquid supply mechanism (not shown) into the nozzle hole 6a from below and is then delivered from the nozzle hole 6a onto the back surface of the wafer W. For example, the liquid to be thus delivered encompasses a cleaning chemical liquid, a rising liquid such as purified water, and so forth, as in the front side liquid supply nozzle 5. The liquid supply mechanism for supplying a process liquid into the back side liquid supply nozzle 6 may be structured the same as the liquid supply mechanism 85 except for the IPA supply circuit. The elevating member 13 includes a wafer support head 24 at the top for supporting the wafer W. The wafer support head 24 is provided with three wafer support pins 25 for supporting the wafer W (only two of them are shown) on the upper surface. The lower end of the back side liquid supply nozzle 6 is connected to a cylinder mechanism 27 through a connector 26. The elevating member 13 is movable up and down by the cylinder mechanism 27 to move up and down the wafer W for loading and unloading the wafer W.

The rotary cup 4 includes an annular eaves portion 31 inclined to extend inward and upward from a position above the end of the rotary plate 11 and a cylindrical outer wall portion 32 extending vertically downward from the outer end of the eaves portion 31. As shown in the enlarged view of FIG. 4, an annular gap 33 is formed between the outer wall portion 32 and rotary plate 11, so that a process liquid or rinsing liquid scattered by rotation of the wafer W along with the rotary plate 11 and rotary cup 4 is guided downward through the gap 33.

Figure 5:
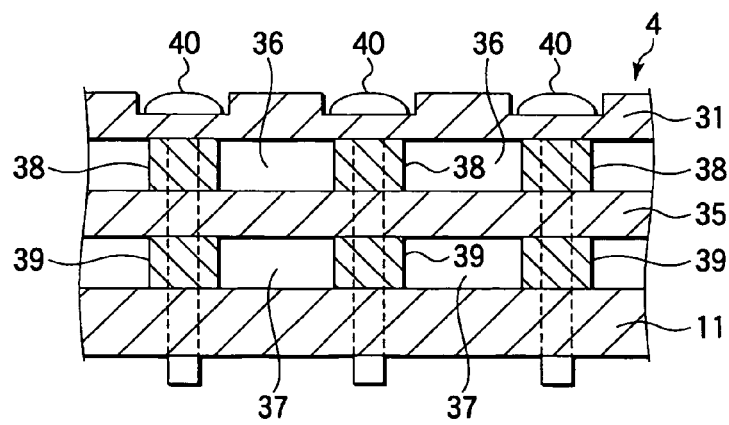
[FIG. 5] This is a view for explaining the attached state of a rotary cup and a guide member used in the substrate processing apparatus shown in FIG. 1.

A plate-like guide member 35 is disposed between the eaves portion 31 and rotary plate 11 at a height essentially the same as the wafer W. As shown in FIG. 5, a plurality of spacers 38 and 39 are disposed in an annular direction between the eaves portion 31 and guide member 35 and between the guide member 35 and rotary plate 11 to form openings 36 and 37 for allowing the process liquid or rinsing liquid to pass therethrough. The eaves portion 31, guide member 35, rotary plate 11, and spacers 38 and 39 disposed therebetween are fixed to each other by screws 40.

The guide member 35 is arranged such that the upper and lower surfaces thereof are to be almost continued to the front and back surfaces of the wafer W. When a process liquid is supplied onto the center of the front surface of the wafer W from the front side liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the guide member 35. Then, the process liquid is discharged outward through the openings 36, and is guided downward by the outer wall portion 32. Similarly, when a process liquid is supplied onto the center of the back surface of the wafer W from the back side liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the guide member 35 almost continued thereto. Then, the process liquid is discharged outward through the openings 37, and is guided downward by the outer wall portion 32. At this time, since a centrifugal force acts on the process liquid guided to the spacers 38 and 39 and outer wall portion 32, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup 4 while preventing the process liquid from being turned into mist. As shown in FIG. 2, the guide member 35 has notches 41 at positions corresponding to the wafer holding accessories 14 to accept the wafer holding accessories 14.

The exhaust/drain section 7 is mainly used for collecting exhaust gas and drainage discharged from the space surrounded by the rotary plate 11 and rotary cup 4. As shown in the enlarged view of FIG. 4, the exhaust/drain section 7 includes an annular drain cup 51 disposed to receive the process liquid or rinsing liquid discharged from the rotary cup 4, and an annular exhaust cup 52 disposed concentrically with the drain cup 51 to accommodate the drain cup 51.

As shown in FIGS. 1 and 4, the drain cup 51 includes a cylindrical outer sidewall 53 vertically disposed outside the rotary cup 4 adjacent to the outer wall portion 32, and an internal wall 54 extending inward from the lower end of the outer sidewall 53. The internal wall 54 is connected to an inner sidewall 54a vertically disposed on the inner side. The outer sidewall 53 and internal wall 54 define an annular space used as a liquid receptacle 56 for receiving the process liquid or rinsing liquid discharged from the rotary cup 4. The upper side of the outer sidewall 53 is formed as an extending portion 53a extending to a position above the rotary cup 4 to prevent the process liquid from bouncing out from the drain cup 51. The drain cup 51 further includes an annular partition wall 55 disposed in an annular direction on the liquid receptacle 56 outside the holding accessories 14 and extending from the internal wall 54 to a position near the lower surface of the rotary plate 11. The liquid receptacle 56 is divided by the partition wall 55 into a main cup portion 56a and an auxiliary cup portion 56b. The main cup portion 56a is used to receive liquid discharged from the gap 33, while the auxiliary cup portion 56b is used to receive liquid dropping from portions near the holding portions 14a of the holding accessories 14. The bottom 57 of the liquid receptacle 56 is divided by the partition wall 55 into a first portion 57a corresponding to the main cup portion 56a and a second portion 57b corresponding to the auxiliary cup portion 56b. The first and second portions 54a and 54b are inclined upward and inward (toward the rotational center). The inner side of the second portion 57b extends inward (toward the rotational center) further from a position corresponding to the holding portions 14a of the holding accessories 14. The partition wall 55 serves to prevent a gas flow formed by the portions of the holding accessories 14 protruding downward below the rotary plate 11 from involving and transferring mist onto the wafer W, when the rotary plate 11 is rotated. The partition wall 55 has a hole 58 formed therein to guide the process liquid from the auxiliary cup portion 56b to the main cup portion 56a (see FIG. 1).

The drain cup 51 has a drain port 60 for drainage from the liquid receptacle 56, which is formed in the internal wall 54 at one position on the outermost side and connected to a drain tube 61 (see FIG. 1). The drain tube 61 is provided with a drain-switching member 111, which is connected to an acid discharge tube 112a for discharging acidic drainage, an alkali discharge tube 112b for discharging alkaline drainage, an acid collection tube 112c for collecting acid, and an alkali collection tube 112d for collecting alkali, all of them extending vertically downward. The acid discharge tube 112a, alkali discharge tube 112b, acid collection tube 112c, and alkali collection tube 112d are respectively provided with valves 113a, 113b, 113c, and 113d. With this arrangement, the process liquids are separately collected or discarded in accordance with the types thereof. More specifically, when cleaning is performed by use of dilute hydrofluoric acid (DHF), the drain-switching member 111 is switched to the acid collection tube 112c to collect drainage of the dilute hydrofluoric acid (DHF). When a rinsing process is performed after the cleaning using the dilute hydrofluoric acid (DHF), the drain-switching member 111 is switched to the acid discharge tube 112a to discard drainage of the dilute hydrofluoric acid (DHF) mixed with the rinsing liquid. Further, when cleaning is performed by use of ammonia hydrogen peroxide solution (SC1), the drain-switching member 111 is switched to the alkali collection tube 112d to collect drainage of the ammonia hydrogen peroxide solution (SC1). When a rinsing process is performed after the cleaning using the ammonia hydrogen peroxide solution (SC1), the drain-switching member 111 is switched to the alkali discharge tube 112b to discard drainage of the ammonia hydrogen peroxide solution (SC1) mixed with the rinsing liquid. In place of a single drain port 60, a plurality of drain ports 60 may be formed.

When the rotary plate 11 and rotary cup 4 are rotated along with the wafer W, the process liquid or rinsing liquid discharged and received from the rotary cup 4 generates a circular flow inside the drain cup 51 and is drained through the drain port 60 to the drain tube 61. The circular flow may be generated only by rotation of the rotary plate 11 along with the wafer W. However, in this embodiment, the lower side of the outer wall portion 32 is inserted into the drain cup 51 to generate a circular gas flow when the rotary cup 4 is rotated. In this case, the process liquid or rinsing liquid accompanies the circular gas flow inside the drain cup 51, and generates a circular flow with a higher velocity as compared to a circular flow generated only by rotation of the wafer W and rotary plate 11. Consequently, the liquid is discharged from the drain port 60 more swiftly.

The exhaust cup 52 includes an outer wall 64 vertically extending outside the outer sidewall 53 of the drain cup 51, and an inner wall 65 disposed on the inward side from the holding accessories 14 and vertically extending to have an upper end adjacent to the rotary plate 11. The exhaust cup 52 further includes a bottom wall 66 placed on the base plate 1, and a top wall 67 extending upward and curved from the outer wall 64 to cover an area above the rotary cup 4. The exhaust cup 52 is mainly used for collecting and exhausting gas components from inside and around the rotary cup 4 through an annular inlet port 68 formed between the top wall 67 and eaves portion 31 of the rotary cup 4. As shown in FIGS. 1 and 4, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4. The plurality of exhaust ports 70 can be selectively used by switching in accordance with the types of process liquids.

An outer annular space 99a is formed between the outer wall or outer sidewall 53 of the drain cup 51 and the outer wall 64 of the exhaust cup 52. An annular gas flow adjusting member 97 is disposed between the bottom of the drain cup 51 and the bottom of the exhaust cup 52 outside the exhaust ports 70. The gas flow adjusting member 97 has a number of gas-flow holes 98 formed therein and arrayed in an annular direction. The outer annular space 99a and gas-flow adjusting member 97 serve to adjust a gas flow collected in the exhaust cup 52 so as to uniformly discharge it from the exhaust ports 70. Specifically, this exhaust gas flow is guided downward through the annular space or outer annular space 99a uniformly all over an annular direction, and is then supplied with a pressure loss or resistance by the gas flow adjusting member 97 having a number of gas-flow holes 98. Consequently, the gas flow is distributed and is relatively uniformly discharged to the exhaust ports 70 from all around, regardless of the distance from the exhaust ports 70.

On the other hand, an inner annular space 99b is formed between the inner sidewall 54a of the drain cup 51 and the inner wall 65 of the exhaust cup 52. Further, a gap 77 is formed between the drain cup 51 and the bottom wall of the exhaust cup 52 on the inner peripheral side of the drain cup 51. Gas components collected through the inlet port 68 partly flow into the liquid receptacle 56 of the drain cup 51, as well as the outer annular space 99a. This gas flow is guided downward through the liquid receptacle 56 and inner annular space 99b uniformly all over an annular direction, and is relatively uniformly discharged through the gap 77 to the exhaust ports 70.

As described above, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust ports 70, so that the mist is reliably prevented from diffusing outside.

The substrate processing apparatus 100 includes a process controller 121 comprising a microprocessor (computer), which is connected to and controls the respective components of the substrate processing apparatus 100. The process controller 121 is connected to the user interface 122, which includes, e.g., a keyboard and a display, wherein the keyboard is used for an operator to input commands for operating the respective components of the substrate processing apparatus 100, and the display is used for showing visualized images of the operational status of the respective components of the substrate processing apparatus 100. Further, the process controller 121 is connected to a storage section 123 that stores recipes, i.e., control programs for the process controller 121 to control the substrate processing apparatus 100 so as to perform various processes, and control programs for the respective components of the substrate processing apparatus 100 to perform predetermined processes in accordance with process conditions. The recipes are stored in a storage medium included in the storage section 123. The storage medium may be formed of a medium of the stationary type, such as a hard disk, or a medium of the portable type, such as a CDROM, DVD, or semiconductor memory (for example, a flash memory). Alternatively, the recipes may be used online while they are transmitted from another apparatus through, e.g., a dedicated line, as needed.

A required recipe is retrieved from the storage section 123 and executed by the process controller 121 in accordance with an instruction or the like input through the user interface 122. Consequently, the substrate processing apparatus 100 can perform a predetermined process under the control of the process controller 121.

Next, with reference to FIGS. 6 to 8, an explanation will be given of an operation of the substrate processing apparatus 100 having the structure described above. The operation described below for performing a cleaning process according to this embodiment is controlled by the process controller 121 in accordance with a recipe stored in the storage section 123.

Figure 6:
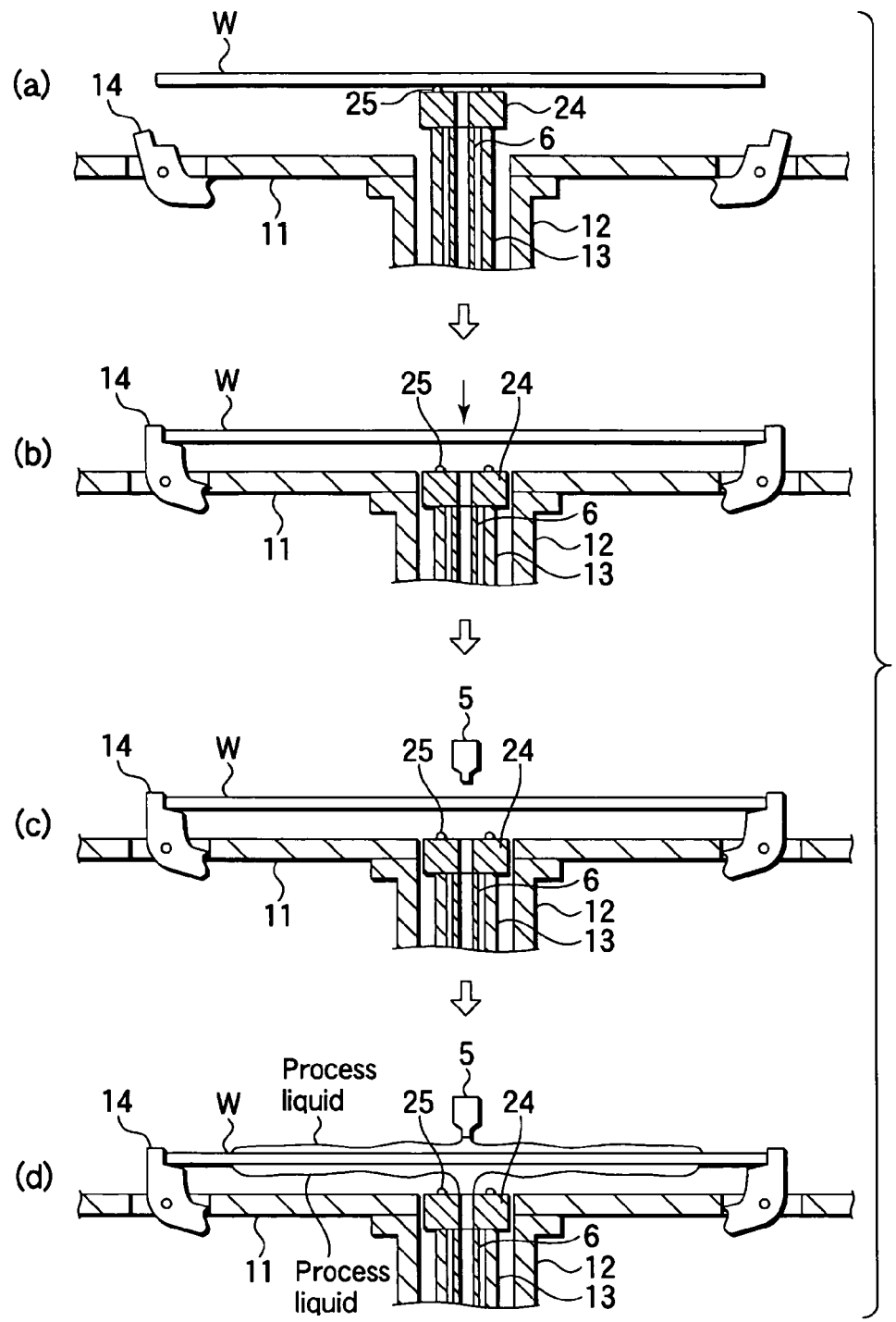
[FIG. 6] This is a view for explaining a process operation of the substrate processing apparatus according to the embodiment of the present invention.
Figure 7:
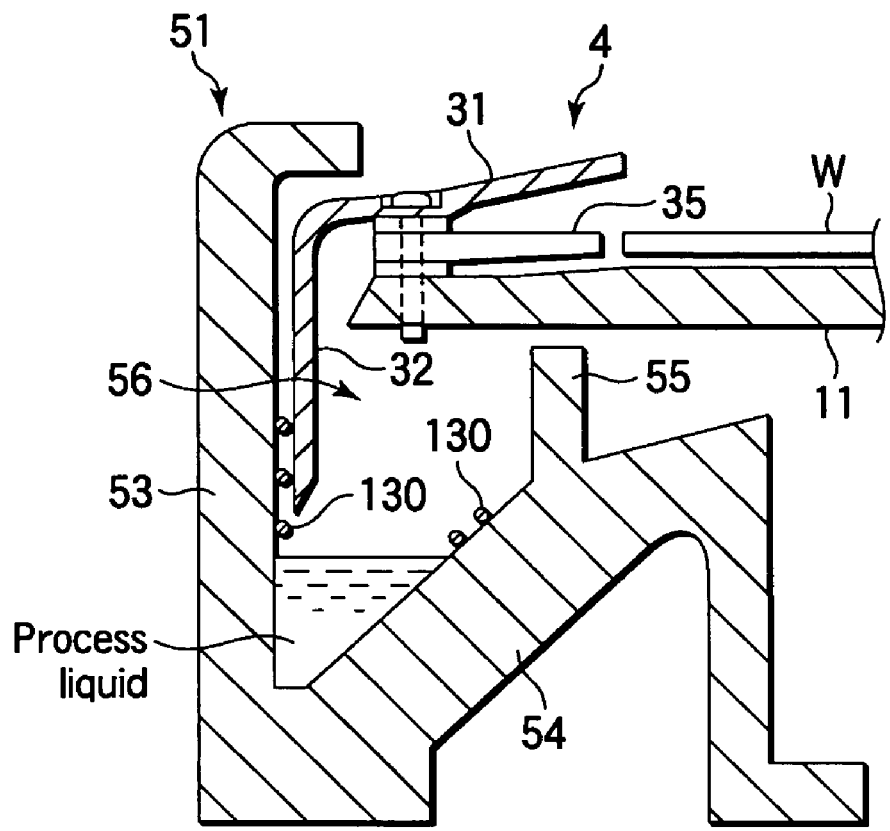
[FIG. 7] This is a sectional view showing the state of deposits after a cleaning process of a drain cup is performed.

The cleaning process using a process liquid (chemical liquid) is performed in accordance with the sequence shown in FIG. 6. Specifically, at first, as shown in (a), the elevating member 13 is set at the upper position, and a wafer W is transferred from a transfer arm (not shown) onto the support pins 25 of the wafer support head 24. Then, as shown in (b), the elevating member 13 is moved down to a position where the wafer W can be held by the holding accessories 14, and then the wafer W is chucked by the holding accessories 14. Then, as shown in (c), the front side liquid supply nozzle 5 is moved from the retreat position to the wafer cleaning position.

In this state, as shown in (d), while the holding member 2 is rotated along with the rotary cup 4 and wafer W by the motor 3, a predetermined process liquid is supplied from the front side liquid supply nozzle 5 and back side liquid supply nozzle 6 to perform a cleaning process.

In this wafer cleaning process, while the wafer W is rotated, the process liquid is supplied from the front side liquid supply nozzle 5 and back side liquid supply nozzle 6 onto the center of the front surface and back surface of the wafer W. Consequently, the process liquid is spread outward by a centrifugal force on the wafer W, while applying a cleaning action onto the wafer W. The process liquid used for the cleaning action is then thrown off from the peripheral edge of the wafer W. In the cleaning process, the rotational speed of the wafer is preferably set to be 200 to 700 rpm. The flow rate of the process liquid is preferably set to be 0.5 to 1.5 L/min.

The cup surrounding the wafer W used in this wafer cleaning process is the rotary cup 4 that is rotated along with the wafer W. Accordingly, when the process liquid thrown off from the wafer W hits against the rotary cup 4, a centrifugal force acts on the process liquid, and the process liquid is thereby inhibited from being scattered (turned into mist), unlike a case where a stationary cup is used for the same purpose. Then, the process liquid is guided downward by the rotary cup 4, and is discharged through the gap 33 into the main cup portion 56a of the liquid receptacle 56 of the drain cup 51. Further, since the rotary plate 11 has holes for inserting the holding portions 14a at positions where the holding accessories 14 are attached, the process liquid drops through the holes into the auxiliary cup portion 56b of the drain cup 51. The process liquid received by the drain cup 51 is discharged through the drain port 60 to the drain tube 61, while it is circulated inside the drain cup 51. At this time, along with rotation of the rotary cup 4, a circular gas flow is generated by the outer wall portion 32 inside the drain cup 51, and the process liquid accompanies the circular gas flow inside the drain cup 51. Consequently, when the process liquid is discharged through the drain port 60 to the drain tube 61, the process liquid generates a circular flow with a higher velocity inside the drain cup 51. Since such a circular flow with a higher velocity is generated, the process liquid is discharged through the drain port 60 to the drain tube 61 in a shorter time.

Further, gas components are mainly collected into the exhaust cup 52 from inside and around the rotary cup 4 through the annular inlet port 68 formed between the top wall 67 and eaves portion 31 of the rotary cup 4, and are then exhausted through the exhaust ports 70 to the exhaust tubes 71.

After the process using a process liquid is performed, as described above, a rinsing process is sequentially performed. In this rinsing process, supply of the process liquid is stopped, and purified water is supplied as a rinsing liquid from the front side liquid supply nozzle 5 and back side liquid supply nozzle 69 onto the front and back surfaces of the wafer W. At this time, as in the cleaning process using a process liquid, while the holding member 2 is rotated along with the rotary cup 4 and wafer W by the motor 3, purified water used as a rinsing liquid is supplied from the front side liquid supply nozzle 5 and back side liquid supply nozzle 6 onto the center of the front and back surfaces of the wafer W. Consequently, the rinsing liquid is spread outward by a centrifugal force on the wafer W, while applying a rinsing action onto the wafer W. The purified water used for the rinsing action is then thrown off from the peripheral edge of the wafer W.

As in the process liquid, the purified water or rinsing liquid thus thrown off is discharged through the gap 33 of the rotary cup 4 and the openings that accept the holding portions 14a into the liquid receptacle 56 of the drain cup 51. Then, the purified water or rinsing liquid is discharged through the drain port 60 to the drain tube 61 while it is circulated inside the drain cup 51. At this time, a circular gas flow is generated by the outer wall portion 32 of the rotary cup 4 inside the drain cup 51, and the purified water or rinsing liquid accompanies the circular gas flow inside the drain cup 51. Consequently, a circular flow with a higher velocity is generated, and so the purified water or rinsing liquid is discharged through the drain port 60 to the drain tube 61 in a shorter time.

As described above, since the process liquid or rinsing liquid is discharged from the annular drain cup 51 in a shorter time, the liquid replacing rate can be increased, where a plurality of process liquids are used. In addition, when process liquids of different types are switched, they are prevented from being mixed with each other when they are discharged.

When the rinsing process using purified water as a rinsing liquid is performed on the wafer W, the purified water thrown off from the wafer W is circulated inside the drain cup 51 and applies a cleaning action onto the interior of the drain cup 51.

Conventionally, in general, rinsing processes of this kind are arranged to supply a rinsing liquid while rotating a wafer at almost the same rotational speed as that of a cleaning process. Consequently, the rinsing liquid is circulated on that portion inside the drain cup 51 on which the process liquid has been circulated, so that the process liquid left inside the drain cup 51 is removed.

However, the process liquid used for the cleaning process and received by the drain cup 51 does not necessarily flow in a laminar flow state inside the liquid receptacle 56, but may from a waved liquid level and/or generate liquid flicks. Consequently, as shown in FIG. 7, deposits 130 of the process liquid are left on portions inside the liquid receptacle 56 above the main flow passage of the circular flow formed in the liquid receptacle 56. Accordingly, it has been found that, even where the wafer W is simply rotated in the rinsing process at the same rotational speed as that of the cleaning process, the process liquid deposited inside the drain cup 51 cannot be sufficiently removed.

In light of this problem, this embodiment is arranged to control the circulation path of purified water used as a rinsing liquid inside the drain cup 51. Next, an explanation will be given of a rinsing process according to this embodiment with reference to FIG. 8.

Figure 8:
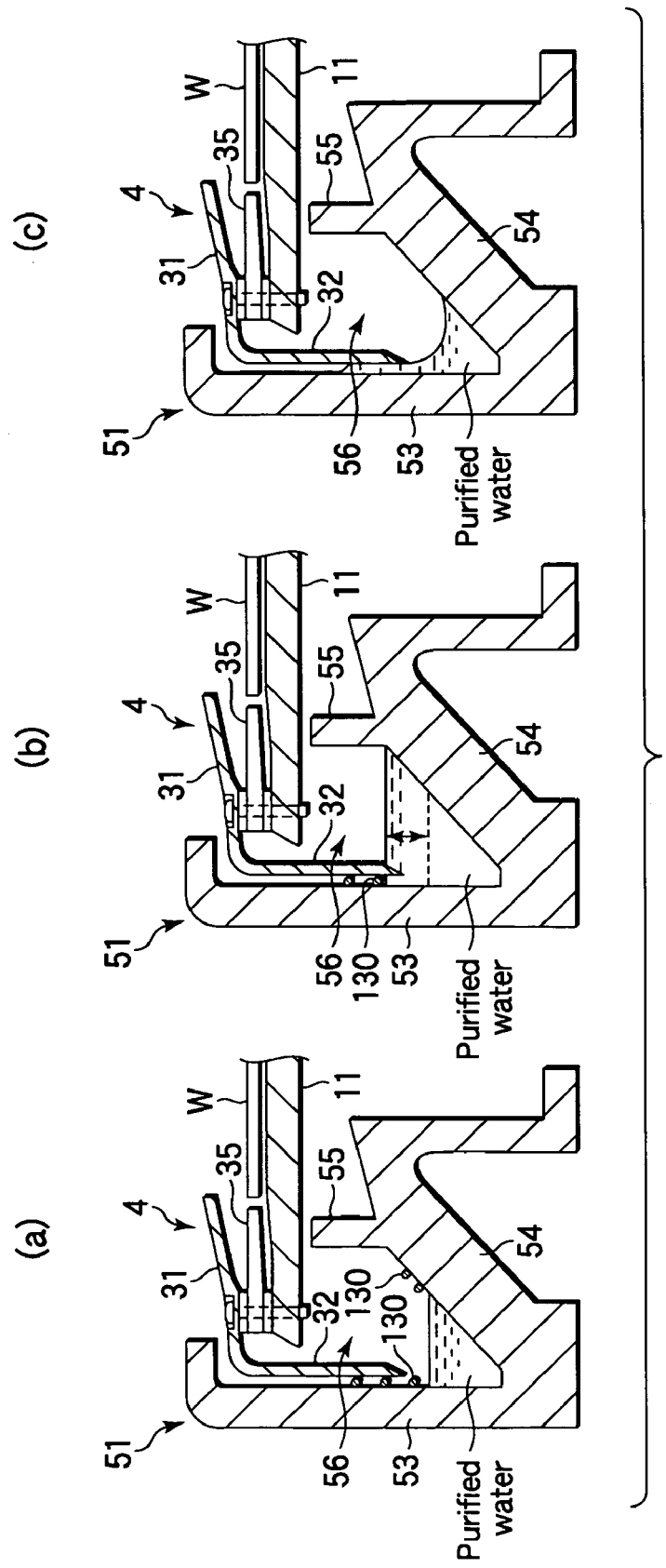
[FIG. 8] This is a view for explaining the sequence of a rinsing process performed in the substrate processing apparatus according to the embodiment.

FIG. 8 shows sectional views for explaining the sequence of a rinsing process performed in the substrate processing apparatus. At first, as shown in (a), in the first step, while the rotational speed of a wafer W is set to be the same as that of the cleaning process, a washing process is performed on the main flow passage, on which the process liquid has been circulated inside the liquid receptacle 56 of the drain cup 51, to remove the process liquid left on this portion. At this time, the flow rate of purified water used as a rinsing liquid is preferably set to be the same as the flow rate of the process liquid. As described above, the cleaning process is preferably arranged to set the rotational speed of the wafer to be 200 to 700 rpm and to set the flow rate of the process liquid to be 0.5 to 1.5 L/min, so the first step is also preferably arranged to set these parameters to fall within the same ranges. Specifically, for example, the process liquid supply in the cleaning process and the rinsing liquid supply in the first step are arranged to use a rotational speed of 300 rpm and a flow rate of 1.5 L/min. The washing process on the main flow passage is preferably kept performed for the time necessary for removing the process liquid left on the main flow passage. For example, this process time may be set at about 5 seconds.

After the first step is finished, as shown in (a), unremoved deposits 130 of the process liquid are still left on those portions inside the liquid receptacle 56 which correspond to the outer sidewall 53 and internal wall 54. The portion corresponding to the outer sidewall 53 receives a larger centrifugal force and thus suffers deposits 130 at higher positions, as compared to the portion corresponding to the internal wall 54. Accordingly, subsequently to the first step, the second step and third step are performed to reliably remove such deposits 130.

In the second step, deposits 130 left on the portion corresponding to the internal wall 54 are removed. Specifically, as shown in (b), since the deposits 130 on the portion corresponding to the internal wall 54 are present at positions not so high, they are treated by raising the liquid level of purified water inside the drain cup 51. Specifically, the liquid level of purified water used as a rinsing liquid is raised to be higher than the positions of the deposits 130 on the portion corresponding to the internal wall 54, so as to remove the deposits 130. Means for raising the liquid level inside the drain cup 51 may be realized by decreasing the rotational speed of the wafer W. Where the rotational speed of the wafer W is decreased, the circular gas flow generated by the outer wall portion 32 of the rotary cup 4 becomes slower, and the circular flow of purified water flowing inside the drain cup 51 becomes also slower. Consequently, the discharge amount of purified water is decreased, and the liquid level of purified water circulating inside the drain cup 51 is thereby raised. At this time, the rotational speed of the wafer W is preferably set to be 50 to 200 rpm. Alternative means for raising the liquid level may be realized by increasing the supply flow rate of purified water. Where the flow rate of purified water inside the drain cup 51 is increased, the liquid level is thereby raised. In this case, the flow rate of purified water is preferably set to be about 1.2 to 2.0 times the flow rate used in the first step. Specifically, for example, the rinsing liquid supply in the second step is arranged to use a rotational speed of 100 rpm and a flow rate of 1.5 L/min, or to use a rotational speed of 300 rpm and a flow rate of 2.0 L/min. The washing process for removing the deposits on the portion corresponding to the internal wall 54 is preferably kept performed for the time necessary for removing the deposits left on the internal wall 54. For example, this process time may be set at about 5 seconds.

In the third step, deposits 130 left on the portion corresponding to the outer sidewall 53 are removed. As described, the deposits 130 on the portion corresponding to the outer sidewall 53 can be present at higher positions due to a larger centrifugal force, and so they cannot be sufficiently removed by simply raising the liquid level of purified water used as a rinsing liquid. Accordingly, as shown in (c), the rotational speed of the wafer W is set to be higher than that of the first step, so that the purified water is raised up to the positions of the deposits 130 on the portion corresponding to the outer sidewall 53 and thereby removes the deposits 130. It is thought that, where the rotational speed of the wafer W is increased, the liquid level of purified water is raised along the inner surface of the outer sidewall 53 due to the following reason. Specifically, along with an increase in the rotational speed of the rotary cup 4, the purified water separated from the peripheral edge thereof collides with the outer sidewall 53 with a larger impact, and further forms a circular flow having a higher velocity that provides a larger centrifugal force. At this time, the rotational speed of the wafer W is preferably set to be 500 to 1,500 rpm. The flow rate of purified water, is preferably set to be 0.5 to 1.5 L/min, which is the same as that of the process liquid in the cleaning process. Specifically, for example, the rinsing liquid supply in the third step is arranged to use a rotational speed of 1,000 rpm and a flow rate of 1.5 L/min. The washing process for removing the deposits on the portion corresponding to the outer sidewall 53 is preferably kept performed for the time necessary for removing the deposits left on the outer sidewall 53. For example, this process time may be set at about 5 seconds.

As described above, the drain cup 51 may be contaminated due to a waved liquid level and/or liquid flicks when the cleaning process is performed by use of a process liquid, such as an alkaline chemical liquid and/or acidic chemical liquid. Even so, where the rinsing process comprising the first to third steps described above is performed, the process liquid including the deposits 130 left inside the drain cup 51 is reliably removed without using a special cleaning mechanism. Accordingly, it is possible to prevent the drying performance of the wafer W from being adversely affected due to evaporation or the like of left part of the process liquid. It should be noted that the order of the second step and third step is not limited to a specific one, i.e., the third step may be performed before the second step.

After the rinsing process described above is finished, a drying process is performed, as needed, by supplying a drying solvent, such as IPA, from the drying solvent nozzle 21 onto the wafer W while rotating the wafer W.

According to this embodiment, an acidic chemical liquid, such as dilute hydrofluoric acid (DHF), and an alkaline chemical liquid, such as ammonia hydrogen peroxide solution (SC1), can be supplied as process liquids to perform continuous processes. For example, at first, a cleaning process is performed by use of one of the chemical liquids in accordance with the sequence described above, and then a rinsing process is performed. Thereafter, another cleaning process is performed by use of the other of the chemical liquids in accordance with the sequence described above, and then a rinsing process is performed. In this case, if the first process liquid is left in the rinsing process performed between the two cleaning processes, salts are produced in the second cleaning process by a reaction between an acid and an alkali as well as evaporation of the process liquids, as described above, and the wafer W is more adversely affected. Accordingly, the rinsing process comprising the first to third steps is effectively applied to the rinsing process performed between these cleaning processes. However, the rinsing process comprising the first to third steps is also preferably applied to the rinsing process performed after the second cleaning process.

In addition to the effects described above, the substrate processing apparatus according to this embodiment can provide the following effects. Specifically, due to the presence of the rotary cup 4, the drain cup 51 can be smaller as long as it is usable for draining. Further, the drain cup 51 and exhaust cup 52 are independent of each other such that exhaust gas and drainage are separately collected and separately discharged through the drain port 60 and exhaust ports 70. Accordingly, there is no need to dispose a special mechanism for separating drainage and exhaust gas. Further, the drain cup 51 is accommodated within the exhaust cup 52. Consequently, the structure for separately collecting exhaust gas and drainage can be arranged to have a smaller occupation space, so the apparatus can be compact with a small foot print. Furthermore, since the drain cup 51 is accommodated within the exhaust cup 52, it is possible to trap mist of the process liquid leaked out of the drain cup 51, thereby preventing the mist from exerting a bad influence while being scattered out of the apparatus.

In the above explanation, the first to third steps shown in FIG. 8 are applied to a rinsing process, but this is not limiting. For example, the first to third steps may be applied to a cleaning process of the drain cup 51 performed by use of a rinsing liquid, such as purified water, separately from a substrate process periodically or as needed. In this case, since no wafer needs to be cleaned, the process may be performed by use of a dummy wafer. However, a product wafer can be alternatively used for this purpose. This cleaning process of the drain cup 51 is also controlled by the process controller 121 in accordance with a recipe stored in the storage section 123.

Where a cleaning process of the drain cup 51 is performed separately from a wafer process, the flexibility of the cleaning process is increased. Further, where the cleaning process of the drain cup 51 comprises the first to third steps as in the rinsing process described above, the deposits and process liquid left inside the drain cup are reliably removed in the same way as the rinsing process, without using a special cleaning mechanism.

Where the first to third steps are applied to a cleaning process of the drain cup 51, a rinsing process may be performed to comprise the first to third steps, or it may be performed in a common way and accompanied by a cup cleaning process comprising the first to third steps.

The present invention is not limited to the embodiment described above, and it may be modified in various manners. For example, the embodiment described above is exemplified by a cleaning processing apparatus for cleaning the front and back surfaces of a wafer. However, the present invention may be applied to a cleaning processing apparatus for cleaning only one of the front and back surfaces. Further, in place of a cleaning process, the present invention may be applied to an apparatus for performing another liquid process. In the embodiment described above, the target substrate is exemplified by a semiconductor wafer, but the present invention may be applied to another substrate, such as a substrate for flat panel display devices (FPD), a representative of which is a glass substrate for liquid crystal display devices (LCD).

INDUSTRIAL APPLICABILITY

The present invention is effectively applied to a cleaning apparatus for removing particles and/or contaminants deposited on a semiconductor wafer.

The invention claimed is:

1. A substrate processing method performed in a substrate processing apparatus that comprises a substrate holding member configured to rotate along with a substrate held thereon in a horizontal state, a process liquid supply mechanism configured to supply a process liquid onto the substrate, a rinsing liquid supply mechanism configured to supply a rinsing liquid onto the substrate, and an annular rotary cup configured to rotate along with the substrate holding member and the substrate held on the substrate holding member, and to surround the substrate held on the substrate holding member and to receive the process liquid or rinsing liquid scattered from the substrate being rotated, an annular drain cup configured to receive liquid discharged from the rotary cup, the drain cup including an annular drain flow passage defined by an outer sidewall that surrounds a lateral side of an edge of the substrate and an internal wall that surrounds a lower side of the edge of the substrate, and a rotation mechanism configured to rotate the substrate holding member and the rotary cup along with the substrate, the method comprising:
 performing a substrate process on the substrate while rotating the substrate held on the substrate holding member by the rotation mechanism and supplying the process liquid onto the substrate from the process liquid supply mechanism; and
 then performing a rinsing process that includes rinsing the substrate while rotating the substrate held on the substrate holding member by the rotation mechanism and supplying the rinsing liquid onto the substrate from the rinsing liquid supply mechanism,
 wherein the rinsing process includes
 adjusting a rotational speed of the substrate to be the same as the rotational speed used in the substrate process while supplying the rinsing liquid, thereby also rinsing the drain flow passage of the drain cup by rinsing liquid thrown off from the substrate,
 raising a liquid level of the rinsing liquid inside the drain flow passage of the drain cup by decreasing the rotational speed of the substrate or increasing a flow rate of the rinsing liquid, as compared to that used in said rinsing the drain flow passage, and
 raising a reach position of the rinsing liquid inside the drain flow passage by increasing the rotational speed of the substrate, as compared to that used in said rinsing the drain flow passage, the reach position being defined by a highest point which the rinsing liquid touches on the outer sidewall of the drain cup.

2. The substrate processing method according to claim 1, wherein the method performs the rinsing process by first using the rotational speed of the substrate process, then raising the liquid level, and then raising the reach position of the rinsing liquid on the outer sidewall of the drain cup.

3. The substrate processing method according to claim 1, wherein the method performs the rinsing process by first using the rotational speed of the substrate process, then raising the reach position of the rinsing liquid on the outer sidewall of the drain cup, and then raising the liquid level.

4. The substrate processing method according to claim 1, wherein the method sets the rotational speed of the substrate to be 200 to 700 rpm in the substrate process, sets the rotational speed of the substrate to be 50 to 200 rpm in said raising the liquid level, and sets the rotational speed of the substrate to be 500 to 1,500 rpm in said raising the reach position of the rinsing liquid on the outer sidewall of the drain cup.

5. The substrate processing method according to claim 1, wherein
 the process liquid supply mechanism is configured to supply a first process liquid and a second process liquid,
 said performing a substrate process on the substrate while supplying the process liquid includes performing a first process on the substrate while supplying the first process liquid onto the substrate and performing a second process on the substrate while supplying the second process liquid onto the substrate,
 said performing a rinsing process includes performing a first rinsing process subsequently to the first process and performing a second rinsing process subsequently to the second process, and
 the first rinsing process includes adjusting a rotational speed of the substrate to be the same as the rotational speed used in the first process while supplying the rinsing liquid, raising the liquid level of the rinsing liquid inside the drain flow passage of the drain cup by decreasing the rotational speed of the substrate or increasing the flow rate of the rinsing liquid, and raising the reach position of the rinsing liquid inside the drain flow passage, on the outer sidewall of the drain cup, by increasing the rotational speed of the substrate.

6. The substrate processing method according to claim 5, wherein the second rinsing process includes adjusting a rotational speed of the substrate to be the same as the rotational speed used in the second process while supplying the rinsing liquid, raising a liquid level of the rinsing liquid inside the drain flow passage of the drain cup by decreasing the rotational speed of the substrate or increasing the flow rate of the rinsing liquid, and raising the reach position of the rinsing liquid inside the drain flow passage, on the outer sidewall of the drain cup, by increasing the rotational speed of the substrate.

\* \* \* \* \*